United States Patent
Thomas et al.

(10) Patent No.: US 7,297,574 B2
(45) Date of Patent: Nov. 20, 2007

(54) MULTI-CHIP DEVICE AND METHOD FOR PRODUCING A MULTI-CHIP DEVICE

(75) Inventors: Jochen Thomas, München (DE); Olaf Schoenfeld, München (DE)

(73) Assignee: Infineon Technologies AG, Munich (DE)

( * ) Notice: Subject to any disclaimer, the term of this patent is extended or adjusted under 35 U.S.C. 154(b) by 68 days.

(21) Appl. No.: 11/155,277

(22) Filed: Jun. 17, 2005

(65) Prior Publication Data

US 2006/0286822 A1  Dec. 21, 2006

(51) Int. Cl.
*H01L 21/00* (2006.01)
*H01L 23/48* (2006.01)
*H01L 23/52* (2006.01)

(52) U.S. Cl. ...................... 438/109; 257/777
(58) Field of Classification Search ................ 257/777; 438/109
See application file for complete search history.

(56) References Cited

U.S. PATENT DOCUMENTS

2005/0051883 A1*  3/2005  Fukazawa ................... 257/686
2006/0195734 A1*  8/2006  Shibata et al. .............. 714/724

* cited by examiner

*Primary Examiner*—David Mis
(74) *Attorney, Agent, or Firm*—Patterson & Sheridan, L.L.P.

(57) ABSTRACT

The present invention relates to a multi-chip device comprising a plurality of chip stacks each including a plurality of single chips stacked on each other, wherein the stacked single chips are electrically interconnected by one or more through-chip-connection extending through at least one of the single chips and a substrate providing one or more first contact elements each of which is in contact with one of the through-chip-connections and providing one or more second contact elements being in electrical contact with the first contact elements, wherein the plurality of chip stacks are stacked onto each other and wherein the second contact elements of one of the chip stacks each being arranged to be in contact to one or more third contact elements of an adjacent one of the chip stacks.

23 Claims, 3 Drawing Sheets

MULTI-CHIP DEVICE AND METHOD FOR PRODUCING A MULTI-CHIP DEVICE

BACKGROUND OF THE INVENTION

1. Field of the Invention

The present invention relates to a multi-chip device including a plurality of chips. The present invention further relates to a method for producing a multi-chip device comprising a plurality of chips.

2. Description of the Related Art

Market requirements demand constantly increasing storage capacity of memory modules. In practice, however, the rate of increase in capacity dictated by the market is not achievable. Consequently, there is a technological gap which is nowadays filled by stacking memory chips onto each other to provide sufficient memory capacity on a memory module.

A number of stacking technologies are known. In one stacking technique, a two or more memory chips are stacked upon each other, each chip being separated by a spacer. Each of the memory chips is separately wire-bonded onto a common substrate which provides an electrical redistribution to, e.g., solder balls and the like by which the stacked chip device can be attached to the memory module board.

Furthermore, it is well known to stack a number of memory chip packages onto a package stack as, e.g., Ball Grid Array (BGA) packages and the like by providing additional contacting pads on a substrate surface of the BGA opposing the surface on which the solder balls are arranged. In this way the ball grid arrays can be soldered onto each other to produce a memory chip stack.

In another technology, memory chips may be provided with through-chip-connections which are used to provide an electrical interconnection between two contact elements on different main surfaces of the chip. The electronic circuit of one chip can be connected to the electronic circuit of an adjacent chip by adjoining the contact elements, wherein the memory chips are stacked without providing a spacer between them such that a high storage density per volume unit can be achieved.

One problem with manufacturing stacked memory chips, is that the manufacturing yield decreases substantially. This is due, at least in part, to the number of manufacturing steps between the providing of the single bare chips and the completing of the multi-chip package, each step having a certain likelihood of a failure. The decrease of the manufacturing yield is substantially independent from the stacking technology used.

Therefore, there is a need for a yield-efficient multi-chip device and a method of manufacturing the same.

SUMMARY OF THE INVENTION

One embodiment of the present invention provides a multi-chip device with stacked memory chips which is designed to be manufactured with an increased yield and which allows an increase in the memory capacity of a multi-chip device of this kind. Another embodiment of the present invention provides a method for manufacturing a multi-chip device having an increased yield.

One embodiment provides a method for manufacturing a multi-chip device in which a first multi-chip stack is stacked with respect to second multi-chip stack to form a multi-chip module. Each stack includes at least two chips in a stacked arrangement, interconnected by through-chip-connectors and disposed on respective substrates.

Another embodiment provides a multi-chip apparatus including a substrate; at least two single chips stacked on each other to form a multi-chip stack, the, wherein the multi-chip stack is disposed on a first surface of the substrate; one or more through-chip-connectors extending through at least one of the single chips to electrically interconnect the at least two single chips; and a first external contact element disposed on the substrate and coupled to the through-chip-connectors for making an electrical off-chip connection between the at least two single chips and a first external component.

Another embodiment provides a multi-chip device having at least two multi-chip stacks. Each stack includes (i) a substrate; (ii) at least two single chips stacked on each other to form a multi-chip stack, wherein the multi-chip stack is disposed on a first surface of the substrate; (iii) one or more through-chip-connectors extending through at least one of the single chips to electrically interconnect the at least two single chips; (iv) a first external contact element disposed on a second surface of the substrate and coupled to the through-chip-connectors for making an electrical off-chip connection, the first surface and the second surface being opposing parallel surfaces; (v) a second external contact element disposed on the first surface of the substrate. Further, the respective first external contact element of a first one of the stacks may be physically connected to the respective second external contact element of a second one of the stacks.

Yet another embodiment provides a device including a multi-stack module defined by a first multi-chip stack and a second multi-chip stack. Each stack includes (i) a substrate; (ii) a stacked arrangement of two or more single chips disposed on a surface of the substrate; and (iii) a through-chip-connector extending through at least one of the single chips of the stacked arrangement to electrically interconnect the two or more single chips. The device further includes a printed circuit board having the multi-stack module disposed on a surface thereof, and wherein the chips of the first and second multi-chip stacks are electrically connected to the printed circuit board.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
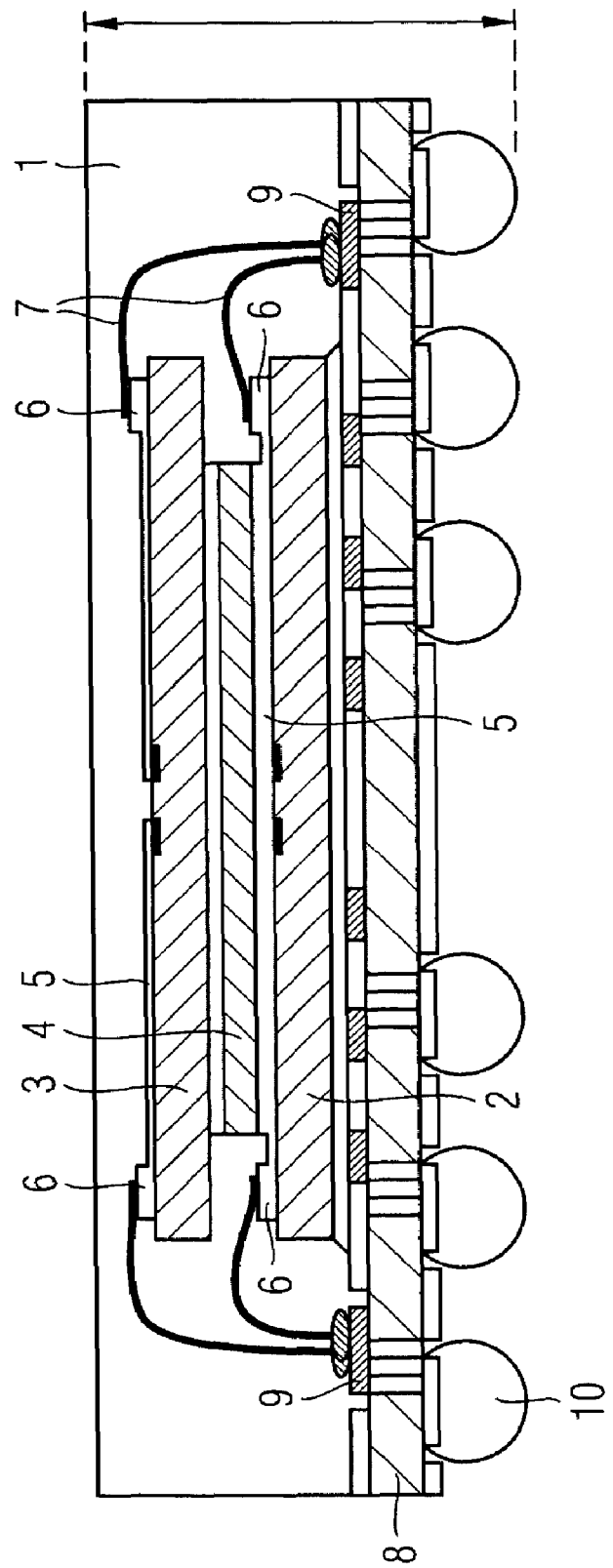
FIG. 1 shows a chip stack in a package according to the prior art.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Further, terms of orientation such as "upper", "lower", "below", "above", etc. are relative and not limiting of embodiments of the invention with respect to a particular orientation.

According to one aspect of the present invention, a plurality of single chips are stacked on each other and are electrically interconnected by means of one or more through-chip-connections extending to at least one of the other single chips in the same stack, thereby forming a multi-chip stack (also referred to herein as simply "chip stack") of interconnected chips. Each of the chip stacks further includes a substrate providing one or more first contact elements, each of which is in contact with one or more through-chip-connections and providing one or more second contact elements being in electrical contact with the first contact elements.

According to another aspect of the invention, a multi-chip device comprising a plurality of multi-chip stacks is provided. The plurality of chip stacks are stacked onto each other. The second contact elements of one of the chip stacks are arranged to be in contact to one or more third contact elements of an adjacent one of the chip stacks.

In one embodiment, the plurality of chip stacks can be stacked upon each other in a direction substantially perpendicular to the main surfaces of the substrates.

According to another embodiment of the present invention, the substrate of each chip stack has a first surface and an opposing second surface, and the stacked single chips and the first contact elements are disposed on the first surface, and the second contact elements are disposed on the second surface.

In a particular embodiment, the chip stacks are stacked onto each other in such a way that the second surface of the one chip stack faces the first surface of the substrate of the adjacent chip stack. In such an embodiment, the second contact elements (disposed on the second surface of the one chip stack) may be physically connected to contact elements disposed on another chip stack.

For at least one of the plurality of chip stacks, the stacked single chips can be arranged in a first area of the first surface and the one or more third contact elements can be arranged in a second area of the first surface.

At least one of the second and third contact elements may have heights extending perpendicularly from the respective surface of the substrate of the respective chip stack, wherein the added height of the second and third contact elements is equal or higher than the height of the stacked single chips between the substrates of the adjacent chip stacks. In this way adjacent substrates are separated by a distance that is greater than the stack height of the chip stack sandwiched between the adjacent substrates, thereby forming a gap between the top of the chip stack and the overlying substrate. In one embodiment, a member may be disposed in the gap.

Preferably, the second contact elements and the third contact elements are each provided as at least one of solder balls, solder piles and contact pads. Thereby it can be achieved that no further conductive element has to be provided to form an electrical connection between the second and the third contact elements.

Preferably, the substrate of the chip stacks comprises a redistribution layer to provide an electrical interconnection between at least two of one of the first contact elements, one of the second contact elements and one of the third contact elements.

Furthermore, it can be provided that between two adjacent chip stacks at least one of a heat conducting layer and a heat conducting element is arranged. Preferably the heat conducting layer or structure is one of a thermal grease, thermal balls and a heatspreader element.

According to another embodiment of the present invention, the chip stacks are stacked in a way that at least one substrate of the chip stacks is arranged to provide an outer surface of the multi-chip device.

Preferably, the chip stack providing the substrate-having the outer surface of the multi-chip device has one or more second contact structure and/or thermal conduction elements in an area of the second surface of the substrate opposing the first area of the first surface on which the stacked single chips of the respective chip stack are attached.

In one embodiment, the chip stacks may be stacked such that at least one of the stacked single chips is arranged to provide an outer surface of the multi-chip device wherein a heat conductive element is arranged on the stacked single chip having the outer surface.

In one embodiment, a heat conductive element can be provided between two adjacent chip stacks.

In one embodiment, one or more of the stacked single chips in a multi-chip device are memory chips.

According to another aspect of the present invention, a method for producing such a multi-chip device is provided. The method comprises the steps of providing a plurality of chip stacks including a plurality of single chips stacked on each other and electrically interconnected to each other by one or more through-chip-connections extending through at least one of the single chips and a substrate having one or more first contact elements for contacting the one or more through-chip connections respectively and one or more second contact elements each one being in electrical contact with at least one of the first contact elements. Thereafter, the stacking of the chip stacks is performed. The chip stacks are bonded with one another such that the substrates of each of the chip stacks are electrically interconnected by forming a respective interconnection between one of the second contact elements and one of the third contact elements of an adjacent chips stack.

According to one embodiment of the present invention, each of the plurality of chip stacks is tested and is rejected (or repaired) if the respective chip stack has any failures before the steps of stacking and bonding, thereby increasing the yield for producing the multi-chip device.

In FIG. 1, a multi-chip device according to the prior art is depicted. The device of FIG. 1 shows a package 1 wherein a first chip 2 and a second chip 3 are stacked on each other separated by a spacer 4. Each of the chips 2, 3 is provided with a redistribution layer 5 on a surface of the chip 2, 3 which connects the integrated circuits on the chips 2, 3 to respective contact pads 6 which are wire bonded via bond wires 7 to respective contact elements 9 on a first surface of a substrate 8. The contact elements 9 on the first surface on the substrate 8 are in connection to solder balls 10 on a second surface of the substrate 8 via a redistribution wiring on or in the substrate 8. Thereby a package can be formed wherein the package comprises two stacked chips to increase the system density of the device.

Future needs require that the system or module density of a device increases faster than the increase of storage density of the electronic circuits of a single chip allows to. This makes it necessary to include a larger number of single chips into one package. Such multi-chip devices are difficult to manufacture according to the above-mentioned design as each of the single chips in such a device have to be bonded separately and have to be spaced from one another by the spacer 4 which quickly increases the overall height of such a multi-chip package. Furthermore, the overall yield of the producing of such a multi-chip package suffers due to the number of manufacturing steps between the providing of the single bare chips and the completing of the multi-chip package, each step having a certain likelihood of a failure.

Figure 2:
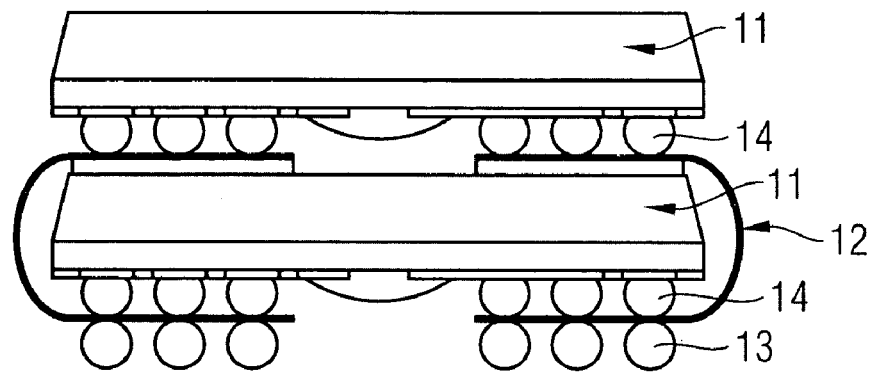
FIG. 2 shows a package stack according to the prior art.

Another approach to increase the system density by combining a number of single chips is shown in FIG. 2. FIG. 2 shows two FBGA packages 11 each including a single chip which can be electrically connected via the solder balls 14 provided on a contacting surface of each FBGA package. The two FBGA packages as shown in FIG. 2 are stacked onto one another by means of two interconnection elements 12 which are U-shaped to form two planes on which contact pads are arranged. The contact pads are contacted by the solder balls 14 of the two FBGA packages 11. The interconnection elements 12 further have a portion on which additional solder balls 13 are arranged and interconnected with the solder balls 14 of the first and second FBGA package, respectively. By such a multi-chip device the system density can be increased whereas the benefit of the increased system density of such a device is restricted by the quickly increasing height of such a multi-chip device as each of the single chips is packaged in its own FBGA package 11.

Figure 3A:
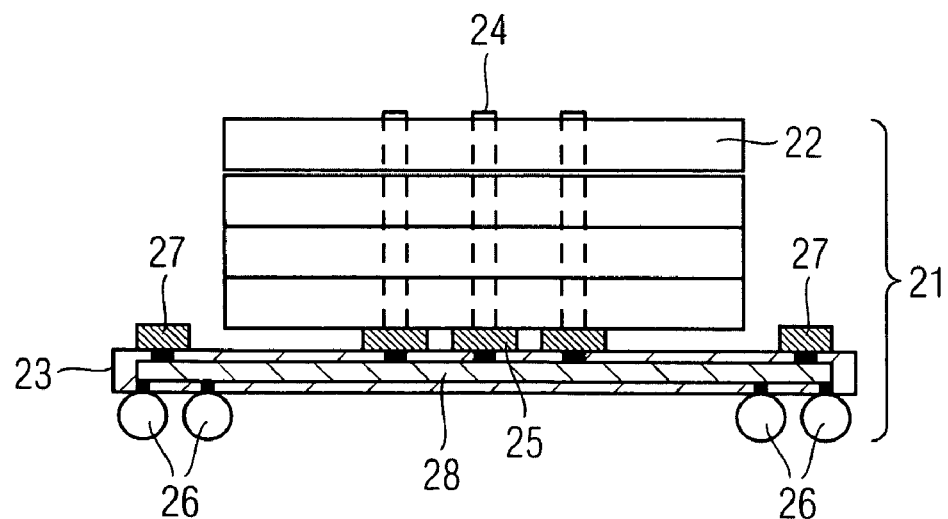
FIG. 3 shows a multi-chip device according to a first embodiment of the present invention.
Figure 3B:
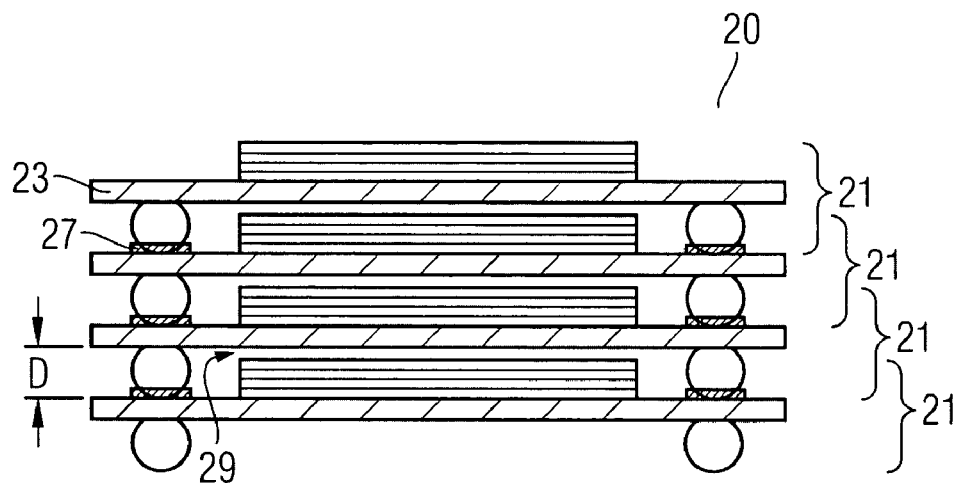

In FIGS. 3*a* and 3*b* (collectively referred to as FIG. 3), one embodiment of the present invention is depicted. More specifically, FIG. 3*a* shows a multi-chip stack 21 and FIG. 3*b* shows a multi-chip device 20 constructed using a plurality of the multi-chip stacks 21. Accordingly, the multi-chip device 20 according to the embodiment of FIG. 3 combines two stacking types. Referring first to FIG. 3*a*, each of the chip stacks 21 has a plurality of single chips 22 (four shown by way of example) stacked on each other and electrically interconnected with each other by one or more through-chip-connections 24 extending through at least one of the single chips 22. The single chips 22 are usually made of silicon and include an electronic circuit, preferably a memory circuit such as, e.g., a DRAM circuit. Furthermore, each of the chip stacks 21 comprises a substrate 23 on which the stacked single chips 22 are attached. The through-chip-connections 24 extend through the single chips 22 and provide contact points on opposing surfaces of the single chips 22. The through-chip-connections are preferably arranged such that while stacking the single chips 22 onto each other the contact points on adjoining surfaces of adjacent single chips are in contact to each other. In the illustrated embodiment, the through-chip-connection of every single chip is placed in a way that the contact points match to provide an interconnection through all single chips of the stack.

The single chip stack 21 formed by the single chips 22 is arranged on the substrate 23 which comprises first contact elements 25 provided as contact pads, which are arranged such that they are in electrical contact with the contact points of the through-chip-connections 24 of the single chips 22 when the stack 21 is attached onto the substrate 23. The first contact elements 25 are electrically contacted with second contact elements 26. The substrate 23 comprises, therefore, one or more redistribution layers 28 which provide that the integrated circuits of the single chips can be electrically connected and controlled via the second contact elements 26. In one embodiment, the contact elements 26 are solder balls 26, as are well known from package types such as ball grid arrays and the like.

Referring now to FIG. 3*b*, the multi-chip device 20 is shown with four chip stacks 21. The chip stacks 21 are stacked onto one another such that the main surfaces of the substrates are arranged parallel to each other. Thereby, the solder balls 26 come into contact with third contact elements 27 which are provided as third contact pads 27 on the same surface of the substrate 23 as the first contact elements 25. The chip stacks 21 are attached onto one another by soldering the solder balls 26 onto the contact pads 27 such that an electrical connection between the single chips stack of each of the chip stacks 21 can be achieved and a mechanical bridge attachment of the four chip stacks can be achieved.

In one embodiment, the solder ball 26 soldered on the contact pad 27 forms a height which is equal or higher than the height of the single chips stack provided on the respective substrate 23. In the soldered condition, the combined height of the solder ball 26 and the contact pad 27 ensures a separation (D) between adjacent chip stacks 21, which may be sufficient to form a gap 29 that prevents the substrate 23 of one chip stack from coming in direct contact with an adjacent chip stack.

Figure 4:
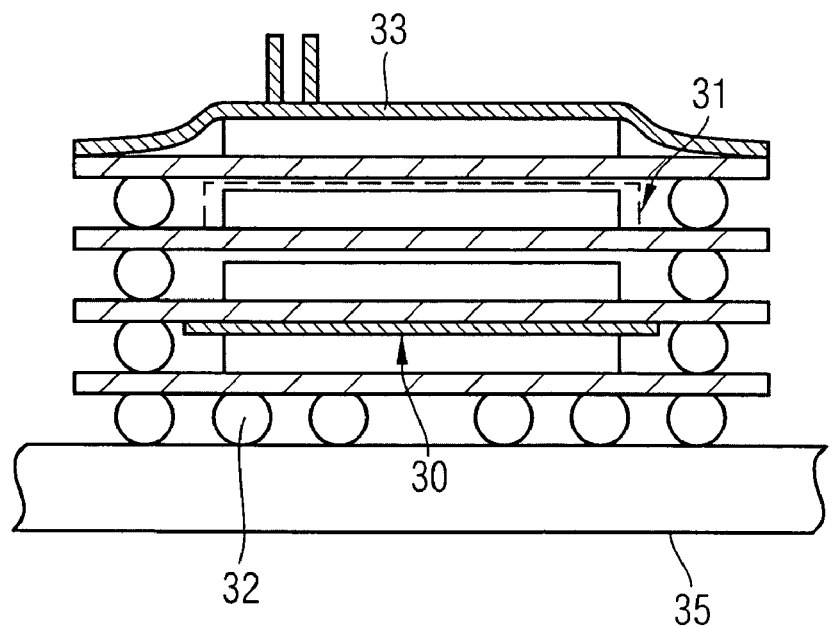
FIG. 4 shows a multi-chip device according to a second embodiment of the present invention.

As shown in FIG. 4, a heat conducting element 30 or a heat conducting layer 31 can be provided between two adjacent chip stacks 21. As shown in the embodiment of FIG. 4, the heat conductive element 30 can be provided as a heat spreader which includes a heat conducting material such as, e.g., copper and the like. The heat conducting layer 31 can include, e.g., a thermal grease 31 and the like. On the outer surface (that provides the external electrical interface to a system printed circuit board 35), the multi-chip device 20 can further be provided additional thermal balls 32 to improve the heat dissipation of the multi-chip device to the system printed circuit board. Furthermore, in one embodiment, a heat spreader 33 can be applied to the upper surface of the top chip stack 21.

While in the illustrated embodiments four single chips are stacked in each chip stack 21 and four chip stacks 21 are stacked to form the multi-chip device 20, the number of single chips in each chip stack 21 can be more or less than four. Further, it is contemplated that each chip stack in a given multi-chip device may have a different number of chips relative to the other chip stacks in the given multi-chip device. For example, a first chip stack of a multi-chip device may have three single stacked chips, while a second ship stack of the multi-chip device may have five single stacked chips. Furthermore, while the illustrative multi-chip device 20 is shown with four stacked chip stacks 21, any number of chip stacks is contemplated. In one embodiment, the individual chips 22 are memory chips which can be coupled by connecting some, most or each of the input/output ports of the chips in parallel with each other such that through-chip-connections can be employed.

In the described embodiment, the single chips stack is located in a first area of a first surface of the substrate 23 wherein the second and third contacting elements (solder ball 26 and contact pads 27) are located in the second area of the substrate on different surfaces of the substrate.

In one aspect, embodiments of the present invention achieve a substantial increase in the production yield as each of the chip stacks 21 can be tested separately before stacking the chip stacks 21 together to form the multi-chip device 20. If any failure is detected in such a chip stack 21 this failing chip stack can be rejected (and not used for the production of the multi-chip device 20) or can be repaired. In this way, only known good chip stacks are used to form a multi-chip device 20 such that the process steps between the providing of the chip stacks and the manufactures multi-chip device are reduced in number.

While the foregoing is directed to embodiments of the present invention, other and further embodiments of the invention may be devised without departing from the basic scope thereof, and the scope thereof is determined by the claims that follow.

What is claimed is:

1. A method for manufacturing a multi-chip device, comprising:
    providing a first multi-chip stack comprising at least two chips in a stacked arrangement, interconnected by through-chip-connectors and disposed on a first substrate;
    providing a second multi-chip stack comprising at least two chips in a stacked arrangement, interconnected by through-chip-connectors and disposed on a second substrate; and
    stacking the first and second multi-chip stacks with respect to another to form a multi-chip module.

2. The method of claim 1, further comprising: bonding the first and second multi-chip stacks to another.

3. The method of claim 1, further comprising:
    coupling the first and second multi-chip stacks to another using electrical conductive elements; and
    coupling at least one of the first and second multi-chip stacks to a printed circuit board, whereby electrical communication between the first and second multi-chip stacks and the printed circuit board is achieved.

4. The method of claim 1, wherein the first and second multi-chip stacks are stacked so that a lower surface of the first substrate is in facing relation to an upper surface of the second substrate, and wherein electrical conductive elements comprise a first connector disposed on the lower surface and a second connector is disposed on the upper surface, and wherein the first and second connector are in physical contact with one another.

5. The method of claim 1, wherein stacking comprises forming a gap between the first and second multi-chip stacks.

6. The method of claim 1, wherein the chips in the first and second multi-chip stacks are memory chips.

7. The method of claim 1, further comprising disposing the multi-chip module on a surface of a printed circuit board, in a manner so that the multi-chip module extends vertically away from the surface of the printed circuit board.

8. The method of claim 1, further comprising, before stacking, testing the first and second multi-chip stacks for defects.

9. A multi-chip apparatus, comprising:
    a substrate;
    at least two single chips stacked on each other to form a multi-chip stack, wherein the multi-chip stack is disposed on a first surface of the substrate;
    one or more through-chip-connectors extending through at least one of the single chips to electrically interconnect the at least two single chips;
    a first external contact element disposed on the substrate and coupled to the through-chip-connectors for making an electrical off-chip connection between the at least two single chips and a first external component, wherein the first external contact element is disposed on a second surface of the substrate, the first surface and the second surface being opposing parallel surfaces; and
    a second external contact element disposed on the first surface of the substrate and electrically coupled to the first external contact element, the second external contact element being adapted to couple to a second external component.

10. The apparatus of claim 9, further comprising a redistribution layer connecting the external contact element to the through-chip-connectors.

11. The apparatus of claim 9, further comprising a heat spreading member disposed on an uppermost chip of the stack.

12. The apparatus of claim 9, wherein the chips are memory chips.

13. The apparatus of claim 9, wherein the chips are stacked in a direction substantially perpendicular to the first surface of the substrate.

14. The apparatus of claim 9, wherein the through-chip-connectors contact conductive elements disposed on the substrate, and further comprising conductive members disposed on the substrate electrically coupling the conductive elements to the first external contact element.

15. The apparatus of claim 9, wherein at least one of the first external contact element and the second external contact element is as at least one of solder balls, solder piles and contact pads.

16. A multi-chip device, comprising:
    at least two multi-chip stacks, each comprising:
        (i) a substrate;
        (ii) at least two single chips stacked on each other to form a multi-chip stack, wherein the multi-chip stack is disposed on a first surface of the substrate;
        (iii) one or more through-chip-connectors extending through at least one of the single chips to electrically interconnect the at least two single chips; and
        (iv) a first external contact element disposed on a second surface of the substrate and coupled to the through-chip-connectors for making an electrical off-chip connection, the first surface and the second surface being opposing parallel surfaces; and
        (v) a second external contact element disposed on the first surface of the substrate; and
    wherein the respective first external contact element of a first one of the stacks is physically connected to the respective second external contact element of a second one of the stacks.

17. The device of claim 16, wherein the first external contact elements are ball grid arrays.

18. The device of claim 16, further comprising a printed circuit board wherein the respective first external contact element of the second one of the stacks is physically connected to the printed circuit board.

19. The device of claim 16, wherein the chips are memory chips.

20. The device of claim 16, further comprising a heat spreading member disposed on an uppermost chip of at least one of the stacks.

21. The device of claim 16, wherein the first one of the multi-chip stacks is stacked on top of the second one of the multi-chip stacks.

22. The device of claim 16, wherein the first one of the multi-chip stacks is stacked on top of the second one of the multi-chip stacks and wherein a gap is formed between the respective second surface of the first one of the multi-chip stacks and the respective first surface of the second one of the multi-chip stacks.

23. A multi-chip device, comprising:
 (a) a first multi-chip stack, comprising:
  (i) a first substrate;
  (ii) a first stacked arrangement of two or more single chips disposed on a surface of the first substrate; and
  (iii) a first through-chip-connector extending through at least one of the single chips of the first stacked arrangement to electrically interconnect the two or more single chips;
 (b) a second multi-chip stack, comprising:
  (i) a second substrate;
  (ii) a second stacked arrangement of two or more single chips disposed on a surface of the second substrate; and
  (iii) a second through-chip-connector extending through at least one of the single chips of the second stacked arrangement to electrically interconnect the two or more single chips; wherein the first multi-chip stack is disposed on the second multi-chip stack to form a multi-stack module; and
 (c) a printed circuit board having the multi-stack module disposed on a surface thereof, and wherein the chips of the first and second multi-chip stacks are electrically connected to the printed circuit board.

\* \* \* \* \*